United States Patent
Hasnain (10) Patent No.: US 8,207,543 B2
(45) Date of Patent: Jun. 26, 2012

(54) SERIES CONNECTED SEGMENTED LED

(75) Inventor: Ghulam Hasnain, Palo Alto, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 13/049,492

(22) Filed: Mar. 16, 2011

(65) Prior Publication Data

US 2011/0163347 A1     Jul. 7, 2011

Related U.S. Application Data

(63) Continuation of application No. 12/208,502, filed on Sep. 11, 2008, now Pat. No. 7,939,839.

(51) Int. Cl.
*H01L 33/00* (2010.01)

(52) U.S. Cl. ....... 257/93; 257/13; 257/99; 257/E33.062; 257/E33.064; 257/E33.066; 438/34

(58) Field of Classification Search ............ 257/13, 257/93, 99, E33.062, E33.064, E33.066; 438/34

See application file for complete search history.

(56) References Cited

U.S. PATENT DOCUMENTS

| | | | |
|---|---|---|---|
| 7,560,738 B2 * | 7/2009 | Liu | 257/88 |
| 7,700,960 B2 * | 4/2010 | Kim et al. | 257/88 |
| 7,880,182 B2 * | 2/2011 | Yao et al. | 257/88 |
| 7,939,839 B2 * | 5/2011 | Hasnain | 257/93 |
| 7,982,409 B2 * | 7/2011 | Hasnain et al. | 315/294 |
| 2007/0065962 A1 * | 3/2007 | Pichler | 438/47 |
| 2007/0102693 A1 | 5/2007 | Nagai | 257/13 |
| 2008/0230765 A1 * | 9/2008 | Yoon et al. | 257/13 |

FOREIGN PATENT DOCUMENTS

| JP | 2002-076437 A | 3/2002 |
|---|---|---|
| JP | 2005-136142 A | 5/2005 |

OTHER PUBLICATIONS

International Preliminary Report on Patentability, PCT/US2009/054456, Mar. 24, 2011, all pages.

* cited by examiner

*Primary Examiner* — Victor A Mandala
(74) *Attorney, Agent, or Firm* — Calvin B. Ward (57) ABSTRACT

A light source and method for making the same are disclosed. The light source includes a substrate, and a light emitting structure that is divided into segments. The light emitting structure includes a first layer of semiconductor material of a first conductivity type deposited on the substrate, an active layer overlying the first layer, and a second layer of semiconductor material of an opposite conductivity type from the first conductivity type overlying the active layer. A barrier divides the light emitting structure into first and second segments that are electrically isolated from one another. A serial connection electrode connects the first layer in the first segment to the second layer in the second segment. A power contact is electrically connected to the second layer in the first segment, and a second power contact is electrically connected to the first layer in the second segment.

14 Claims, 9 Drawing Sheets

SERIES CONNECTED SEGMENTED LED

CROSS REFERENCE TO RELATED APPLICATIONS

This is a continuation of application Ser. No. 12/208,502 filed on Sep. 11, 2008 now U.S. Pat. No. 7,939,839.

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

For the purposes of this discussion, an LED can be viewed as having three layers, the active layer sandwiched between two other layers. The active layer emits light when holes and electrons from the outer layers combine in the active layer. The holes and electrons are generated by passing a current through the LED. The LED is powered through an electrode that overlies the top layer and a contact that provides an electrical connection to the bottom layer.

The cost of LEDs and the power conversion efficiency are important factors in determining the rate at which this new technology will replace conventional light sources and be utilized in high power applications. The conversion efficiency of an LED is defined to be the ratio of optical power emitted by the LED to the electrical power dissipated. Electrical power that is not converted to light that leaves the LED is converted to heat that raises the temperature of the LED. Heat dissipation often places a limit on the power level at which an LED operates.

The efficiency of conversion of electricity to light depends on the quantum efficiency that depends on the material system in which the LED is constructed, and also on the extraneous resistive losses. For GaN-based LEDs, the p-type layer that overlies the active layer has a very high electrical resistivity. This is also the top layer through which light exits in many designs. Consequently, a transparent conductive layer such as Indium Tin Oxide (ITO) is used to spread the current laterally across the chip and the sheet resistance of this ITO layer is chosen to be comparable to that of the n-type GaN layer underneath the active layers. For large area power chips, to further reduce the electrical resistance, metal electrode fingers are used both on the ITO layer as well as in trenches etched down to expose the n-GaN layer. These metal electrodes being opaque must be made as narrow as possible to minimize blockage of light but this increases the resistance per unit length for a given metal thickness. Thus for a given electrode width, the thickness of the electrode metal must be increased for higher current operation if the voltage drop across the length of the electrodes is to be kept constant and at a minimum.

In addition, the efficiency with which the active layer converts power to light also decreases with current density beyond some point depending on the specific design and quality of the active region layers. Accordingly, the amount of light per unit area of an LED reaches a practical limit. To provide higher light output once this limit is reached, the area of the LED must be increased. However, to provide adequate current spreading over the top surface of the LED, there is a limit to the size of an LED that can be powered from a single contact on the top surface of the LED. When the light is extracted through the top surface of the LED, a transparent conducting layer (such as ITO) is deposited over the top layer for reasons explained earlier. While this material has significantly less resistivity than the underlying GaN, the resistivity of the layer is still significant. In principle, the resistive losses in the ITO layer could be overcome by using thicker layers of ITO; however, ITO is only partially "transparent" with non-negligible absorption in the blue, and hence there is a practical limit to the thickness of the ITO layer. In practice, additional metal contacts are provided on the ITO layer to help with the current spreading; however, such contacts are opaque, and hence, reduce the light output.

As a result of the various tradeoffs between current spreading and absorption of light in the materials over the p-type layer, there is a practical limit to the size of a single LED. Hence, light sources that require more light output than can be provided by a single LED must be constructed from multiple smaller LEDs. To minimize cost, the multiple LEDs are constructed on the same die and are powered from common terminals on that die. Such light sources are sometimes referred to as segmented LEDs. Each segment, however, can be viewed as a single LED that is connected to the other LEDs on the die.

In prior art light sources of this design, the individual segments are connected in parallel. This leads to a number of problems. First, the maximum voltage that can be applied to the light source is determined by the maximum voltage a single LED can withstand, typically a few volts. As a result, the power supply that powers the light source must provide a very high current at a low voltage. This leads to further power losses in the conductors between the power supply and the light source. In addition, the brightness of the individual LEDs can vary over the light source due to processing variations across the die that cause variations in the resistance presented between the two contacts that power each LED.

SUMMARY OF THE INVENTION

The present invention includes a light source and method for making the same. The light source includes a substrate, and a light emitting structure that is divided into segments. The light emitting structure includes a first layer of semiconductor material of a first conductivity type deposited on the substrate, an active layer overlying the first layer, and a second layer of semiconductor material of an opposite conductivity type from the first conductivity type overlying the active layer. The light emitting structure also includes a barrier that divides the light emitting structure into first and second segments that are electrically isolated from one another. A serial connection electrode connects the first layer in the first segment to the second layer in the second segment. The light source is powered through first and second power contacts. The first power contact is electrically connected to the second layer in the first segment, and the second power contact is electrically connected to the first layer in the second segment. The first and second segments generate light when a potential difference is created between the first and second power contacts.

In one aspect of the invention, the barrier includes a trench extending through the light emitting structure. The serial connection electrode includes a layer of electrically conducting material deposited in the trench. The trench has an insulating layer that prevents the layer of electrically conducting material from making direct contact with the first layer or the active layer in the second segment.

In another aspect of the invention, the insulating layer underlies a portion of the serial connection electrode that overlies the active layer in the second segment.

In yet another aspect of the invention, the electrically conducting material includes a metal or ITO.

In a still further aspect of the invention, the barrier is transparent to light traveling in the first layer.

DETAILED DESCRIPTION OF THE PREFERRED EMBODIMENTS OF THE INVENTION

Figure 1:
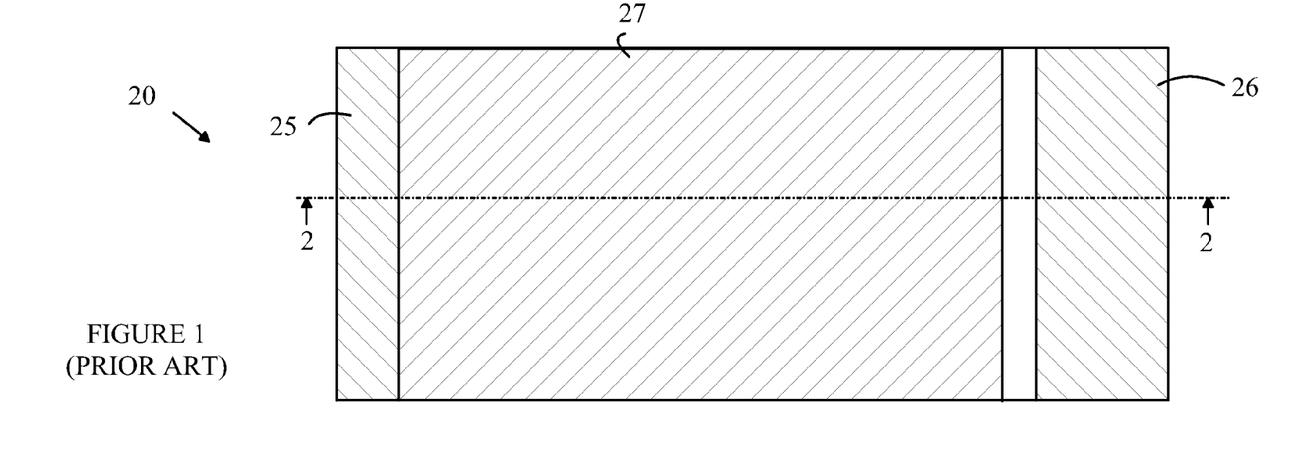
FIG. 1 is top view of a prior art LED.
Figure 2:
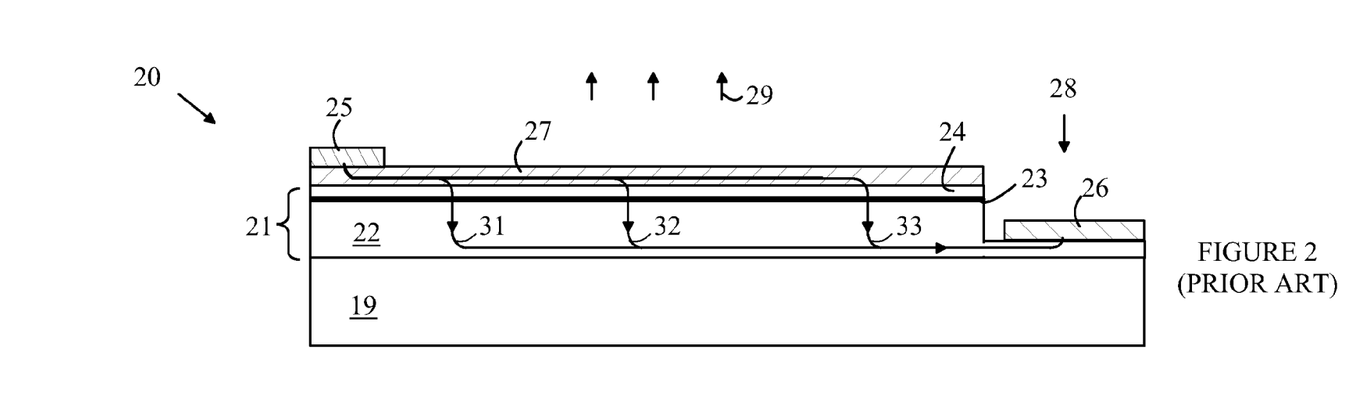
FIG. 2 is a cross-sectional view of prior art LED 20 through line 2-2 shown in FIG. 1.

The manner in which the present invention provides its advantages can be more easily understood with reference to FIGS. 1 and 2, which illustrate a prior art GaN-based LED. FIG. 1 is top view of LED 20, and FIG. 2 is a cross-sectional view of LED 20 through line 2-2 shown in FIG. 1. LED 20 is constructed by growing a light emitting structure 21 having three layers on a sapphire substrate 19. The first layer 22 is an n-type GaN material. The second layer 23 is an active layer that emits light when holes and electrons combine therein. The third layer is a p-type GaN layer 24. Each of these layers may include a number of sub-layers. Since the functions of these sub-layers are well known in the art and are not central to the present discussion, the details of these sub-layers have been omitted from the drawings and the following discussion.

A trench 28 is etched through layers 23 and 24 and a contact 26 is deposited on the bottom surface of the trench 28 to provide an electrical connection to layer 22. The electrical connection to layer 24 is provided by a transparent electrode 27 that is typically constructed from indium tin oxide (ITO). Layer 27 is connected to a second contact 25 that provides the electrical connection to the power source. When power is provided to contacts 25 and 26, light is generated in active layer 23 and extracted from LED 20 through transparent electrode 27 as shown at 29.

The resistivity of p-type GaN is much greater than that of the n-type GaN. To maximize the light generation efficiency of LED 20, the current density across active layer 23 should be uniform. That is, the resistance of paths 31-33 should all be the same. In the absence of layer 27, the resistance of path 31 would be much lower than that of path 33, and hence, light generation would be concentrated in the active region around path 31 leading to a gradient in intensity across the surface of the LED. While the resistivity of ITO is significantly less than that of the p-type GaN, the resistance through the ITO layer is not negligible. As the power output of LEDs is increased, the losses in the ITO become significant and a gradient in light intensity results unless the ITO layer is increased in thickness. Unfortunately, as the ITO thickness increases, the amount of light absorbed in the ITO also increases. The light losses from absorption of light in the ITO become significant when the layer is increased to accommodate the current densities required in high power LEDs.

Figure 3:
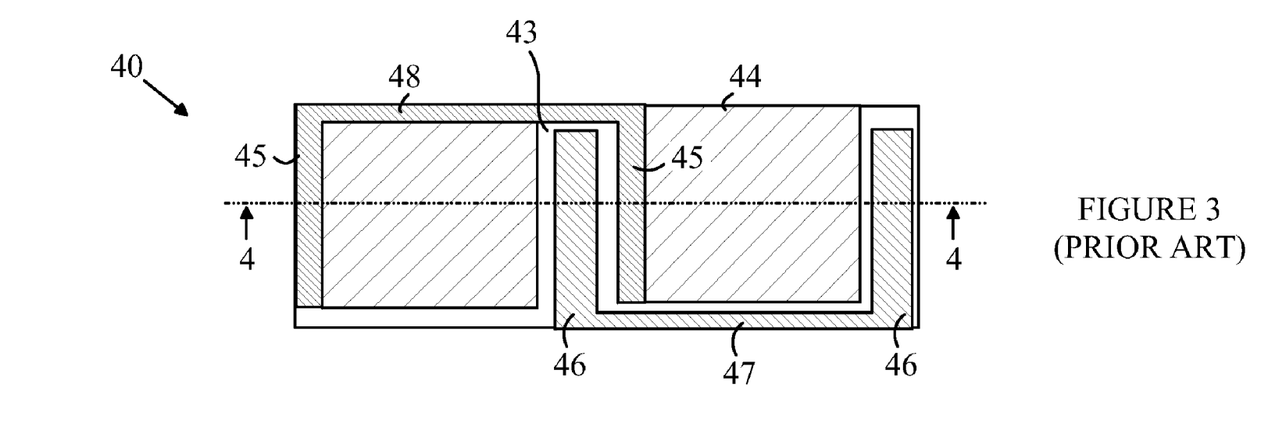
FIG. 3 is a top view of prior art light source.
Figure 4:
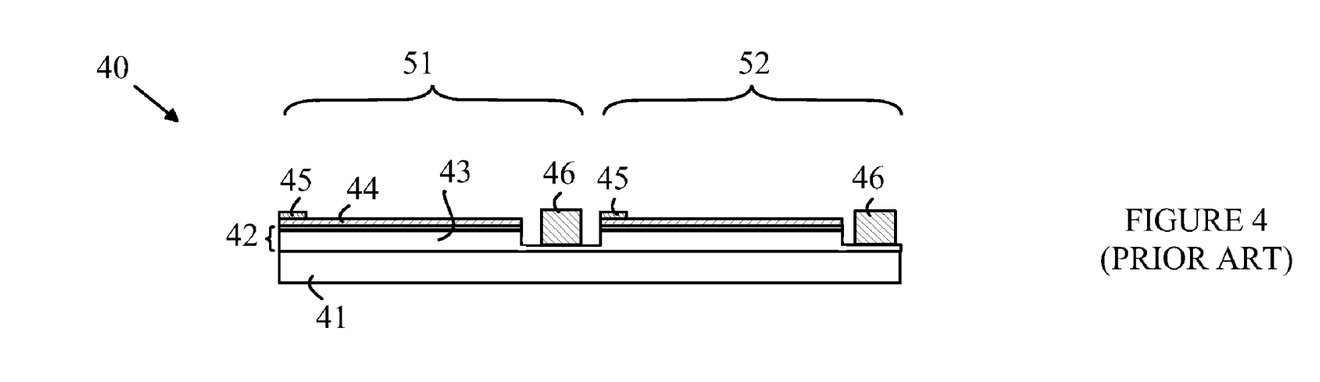
FIG. 4 is a cross-sectional view of prior art light source 40 through line 4-4 shown in FIG. 3.

As noted above, the prior art devices utilize a segmented design to increase the area of the light source that is emitting light, and hence, the total light output. Refer now to FIGS. 3 and 4, which illustrate a prior art segmented light source. FIG. 3 is a top view of light source 40, and FIG. 4 is a cross-sectional view of light source 40 through line 4-4 shown in FIG. 3. To simplify the discussion, light source 40 includes only two segments 51 and 52; however, it will be apparent that additional segments could be utilized. Light source 40 is constructed by growing the conventional three-layer structure 42 on a substrate 41. An ITO layer 44 is deposited over the p-layer. After the layers have been deposited, the structure is etched to expose layer 43 of the three-layer structure. An n-contact 46 is then deposited in the etched trench to provide electrical contact to layer 43. A p-contact 45 is deposited on the segmented ITO layer. The n-contacts in each segment are connected together as shown at 47. Similarly, the p-contacts in each segment are connected together as shown at 48.

It should be noted that this structure can only be utilized in an arrangement in which the segments are connected in parallel, since the segments share a common n-type layer that remains connected after the trenches are etched. Hence, the current that must be carried by conductors 47 and 48 is the sum of the currents needed to power the individual segments. Providing high currents at low voltages presents problems that increase the cost of the light source or decrease the efficiency of light generation. For example, the electrode metal thickness must be increased to lower the metallic resistance, which not only increases chip cost, since the metal is typically gold, but also introduces handling and mechanical issues.

Figure 5:
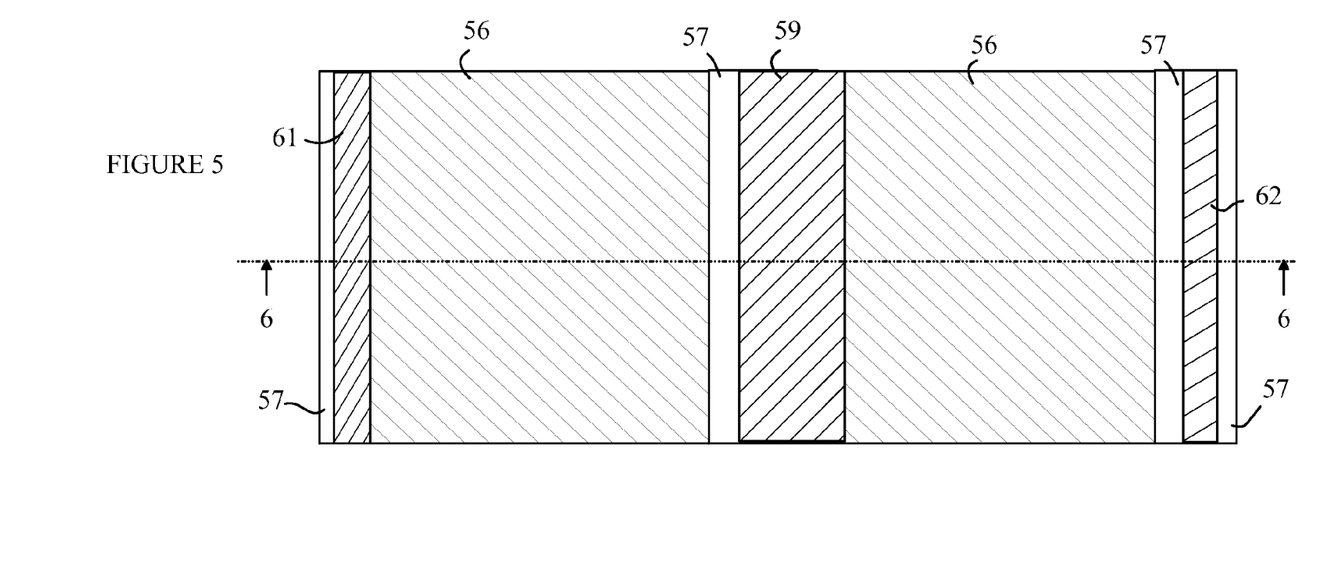
FIG. 5 is a top view of one embodiment of a light source according to the present invention.
Figure 6:
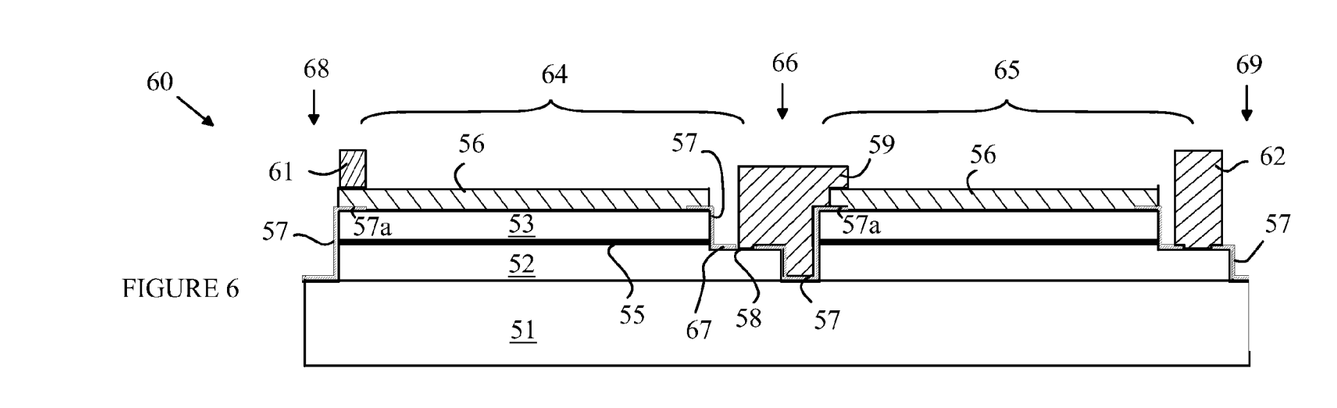
FIG. 6 is a cross-sectional view of light source 60 through line 6-6 shown in FIG. 5.

Refer now to FIGS. 5 and 6, which illustrate a segmented LED light source that utilizes one aspect of the present invention. FIG. 5 is a top view of light source 60, and FIG. 6 is a cross-sectional view of light source 60 through line 6-6 shown in FIG. 5. Light source 60 includes two segments 64 and 65; however, it will be apparent from the following discussion that light sources having many more segments can be constructed from the teachings of the present invention. Light source 60 is constructed from the same three-layer LED structure in which the layers are grown on a sapphire substrate 51. The n-layer 52 is grown on substrate 51, and then the active layer 55 and p-layer 53 are grown over n-layer 52.

The segments 64 and 65 are separated by an isolation trench 66 that extends through layer 52 to substrate 51 thereby electrically isolating segments 64 and 65. Isolation trench 66 includes a plateau 67 that extends only partially into layer 52. The walls of isolation trench 66 are covered by an insulating layer 57 that includes an open area 58 for making electrical contact to the portion of layer 52 associated with each segment. Insulating layer 57 can be constructed from any material that provides an insulating layer that is free of pinhole defects. For example, SiNx can be used as the insulating material. Other materials can include polyimide, BCB, spin-on-glass and materials that are routinely used in the semiconductor industry for device planarization.

Similar trenches are provided on the ends of light source 60 as shown at 68 and 69. A serial connection electrode 59 is deposited in isolation trench 66 such that electrode 59 makes contact with layer 52 through opening 58 in insulating layer 57. Electrode 59 also makes electrical contact with ITO layer 56 in the adjacent segment. Hence, when power is provided via electrodes 61 and 62, segments 64 and 65 are connected in series. As a result, light source 60 operates at twice the voltage and half the current as light source 40 discussed above with respect to FIGS. 3 and 4.

In one aspect of the present invention, insulating layer 57 extends under electrodes 59 and 61 as shown at 57a in FIG. 6. Since electrode 59 is opaque, electrode 59 blocks light generated in the portion of active layer 55 immediately underlying electrode 59. In this regard, it should be noted that the thickness of the layers shown in the figures is not to scale. In practice, the thickness of layer 53 is much smaller than that of layer 52, and hence, electrode 59 blocks most of the light that is generated under electrode 59. Accordingly, current that passes through layer 55 under electrode 59 is substantially wasted, since most of the light generated by that current is lost. The insulating layer extension blocks current from flowing through this wasted area of layer 55, and hence, improves the overall efficiency of the light source. A similar issue is present under electrode 61, and hence, the insulating layer is extended under that electrode as well.

Figure 7:
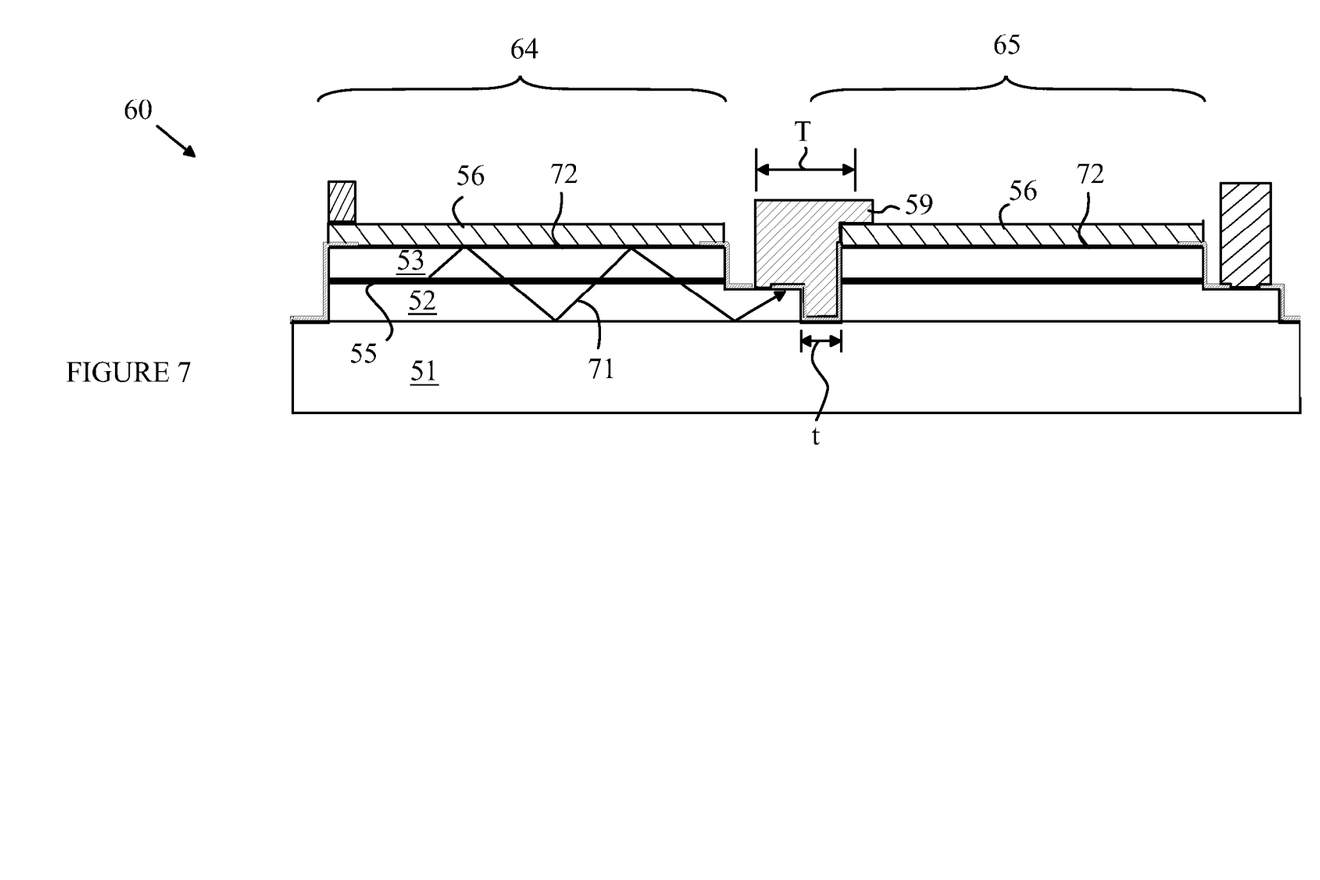
FIG. 7 is another cross-sectional view of light source 60.

Refer now to FIG. 7, which is another cross-sectional view of light source 60. Serial connection electrode 59 can be constructed by depositing a layer of metal such as copper or aluminum. However, such a layer prevents light from moving between segments 64 and 65. In GaN based LEDs, a significant fraction of the light generated in active layer 55 is trapped within the light source due to internal reflections at the boundaries of the light source such as the boundary between substrate 51 and layer 52 and the boundary between layer 53 and ITO layer 56. An exemplary trapped ray is shown at 71.

The trapped light is reflected back and forth between the layers in question until the light is lost due to absorption unless the LED includes some mechanism that randomizes the angles of reflection at one or more of the reflecting surfaces. Typically, the upper surface of layer 53 is roughened. As a result, each time light impinges on boundary 72, the light is either passed through the roughened surface or reflected back at a different angle with respect to the normal to the average surface of layer 53. As a result, some of the light that is reflected at each reflection leaves the surface at an angle that will allow that light to escape the next time the light is reflected upward and encounters surface 72.

If electrode 59 is a metal, light ray 71 will be intercepted by electrode 59 and will either be reflected back into segment 64 or be lost rather than proceeding into segment 65 and again reaching the portion of surface 72 in segment 65. If the light is reflected back into segment 64, some fraction of the light will escape on subsequent encounters with surface 71. Unfortunately, layers of metal deposited on etched surfaces such as the surface of the isolation trench have a reflectivity that is significantly less than 100 percent. In this regard, it should be noted that the various layers in light source 60 are not drawn to scale. In practice, layer 52 is much thicker than the sum of layers 53 and 55. Hence, a significant fraction of the light that strikes electrode 59 will be lost.

In one aspect of the present invention, this light loss problem is reduced by utilizing a transparent conductor such as ITO for electrode 59. The transparency of electrode 59 for the purposes of propagating light between the segments is determined by the cross-section of the layer within the isolation trench that extends to substrate 51, i.e., "t" shown in FIG. 7. The resistance of electrode 59, on the other hand, is determined by the entire cross-sectional area of electrode 59, i.e., the dimension "T" shown in FIG. 7. Hence, electrode 59 can be made thick enough to have an acceptable light transmission while still providing a sufficiently low resistance to current flow between the segments.

It should also be noted that the portion of the insulating layer shown at 57a in FIG. 6 is not needed if electrode 59 is transparent, since light generated under electrode 59 can escape through electrode 59. Hence, the use of a transparent electrode material for electrode 59 also increases the usable area of segment 65.

Figure 8:
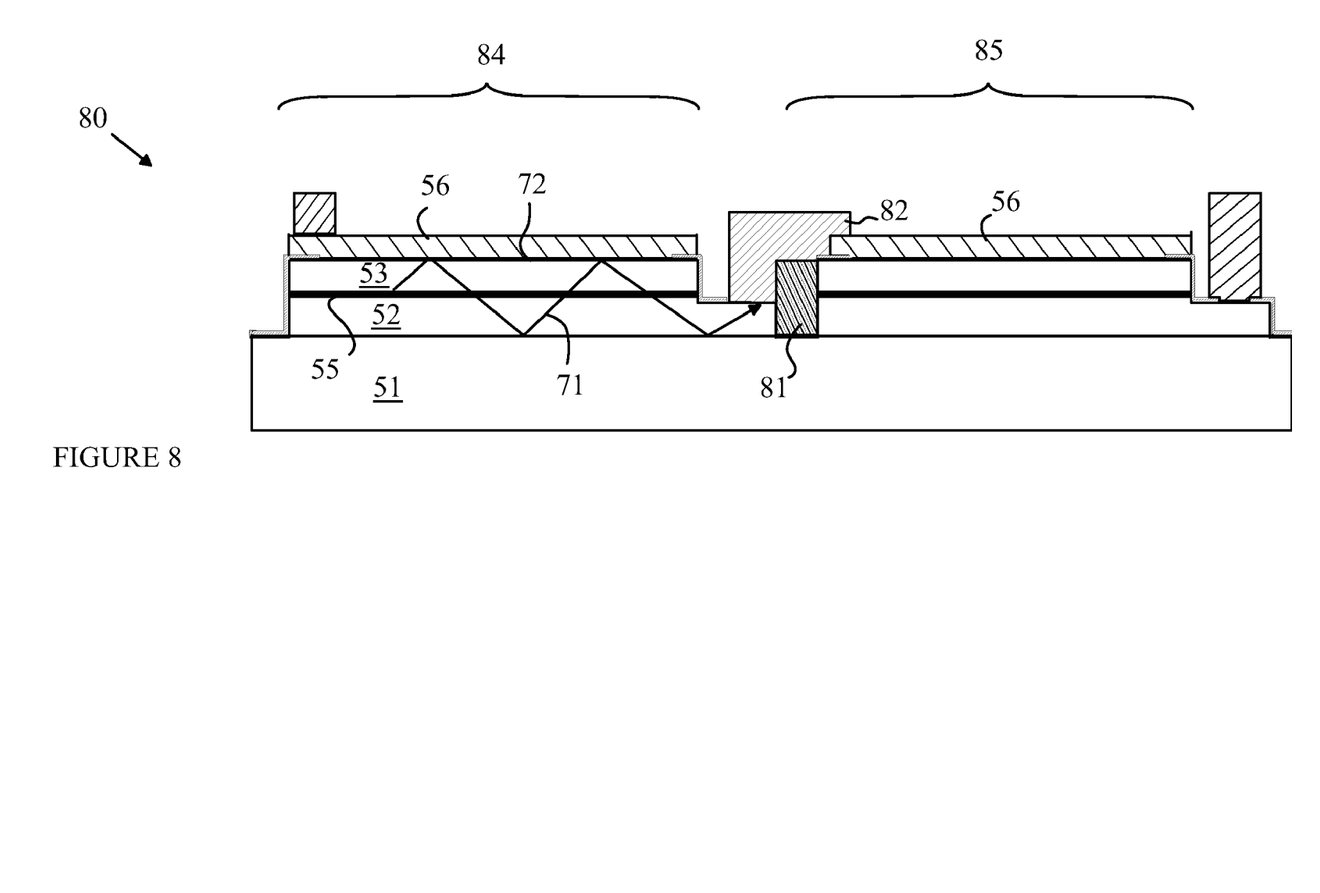
FIG. 8 illustrates an embodiment of the present invention in which the light loss problem is reduced by using a clear insulator to fill the bottom of the isolation trench.

Refer now to FIG. 8, which illustrates an embodiment of the present invention in which the light loss problem discussed above is reduced by using a clear insulator to fill the bottom of the isolation trench. In light source 80, the portion of the isolation trench that extends to substrate 51 is filled with a clear insulator such as the glass layer shown at 81. A separate metal electrode 82 is used to make the serial connection between segments 84 and 85.

Figure 9A:
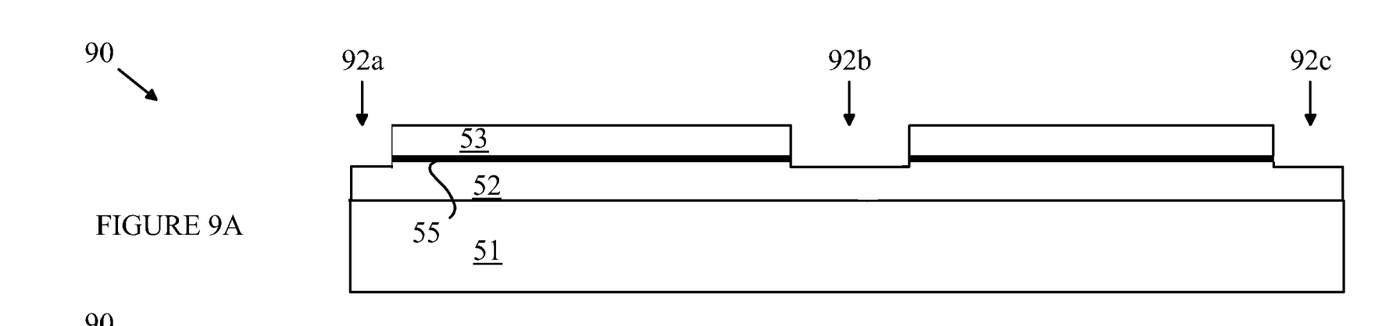
FIGS. 9A-9D illustrate the manner in which a light source that utilizes a metal serial connection electrode is fabricated.

Refer now to FIGS. 9A-9D, which illustrate the manner in which a light source that utilizes a metal serial connection electrode is fabricated. FIGS. 9A-9D are cross-sectional views of a portion of a wafer on which a light source 90 having two segments is shown at various stages in the fabrication process. Referring to FIG. 9A, light source 90 is constructed by depositing GaN layers 52, 55, and 53 on a sapphire substrate 51. This process is conventional in the art, and hence, will not be discussed in detail here. After the layers have been deposited, trenches 92a-92c are etched through layers 53 and 55 and into n-type layer 52.

Figure 9B:
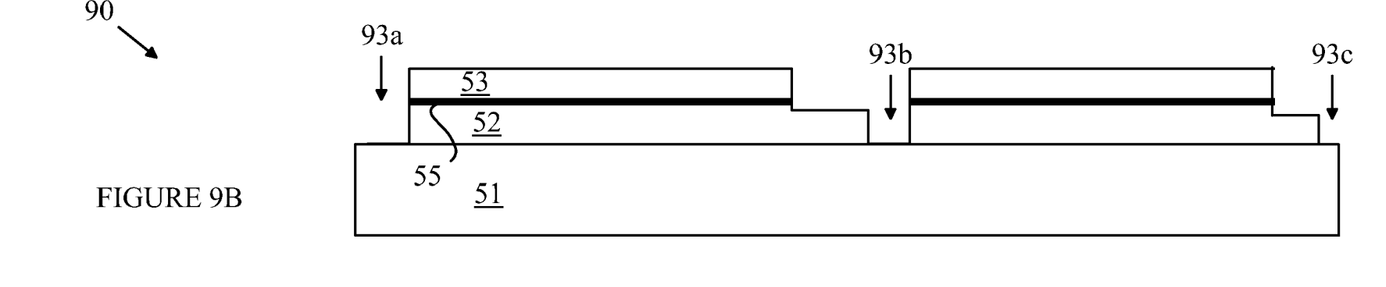
Figure 9C:
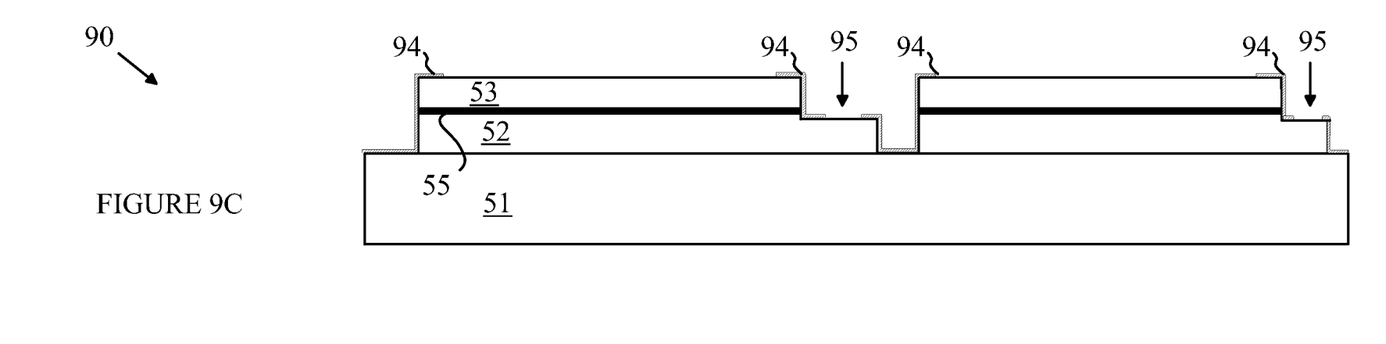

Refer now to FIG. 9B. After trenches 92a-92c have been etched, the wafer is masked and trenches 93a-93c are etched down to substrate 51. Trench 93b is used to construct the isolation trench discussed above. Referring to FIG. 9c, a patterned insulating layer 94 of SiN is then deposited on the walls of the trenches, and openings 95 are etched in layer 94 to provide electrical access to layer 52.

Figure 9D:
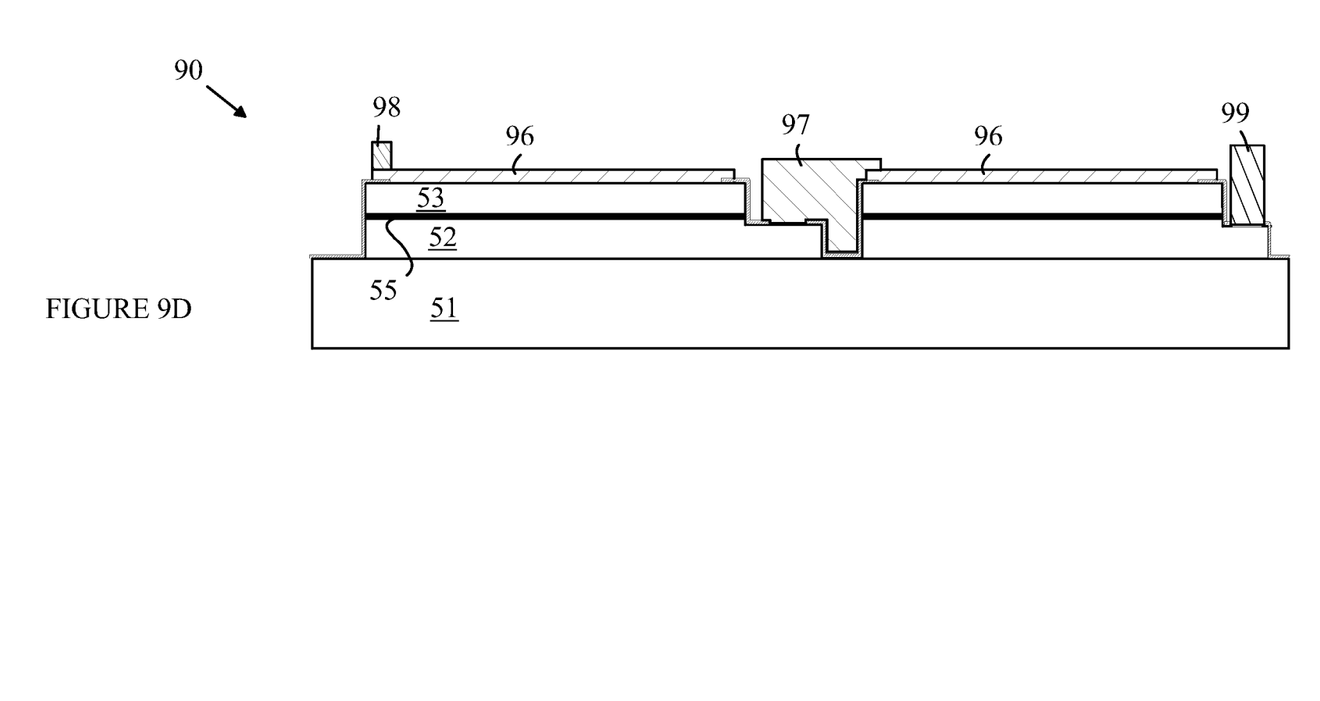

Refer now to FIG. 9D. Next a patterned ITO layer 96 is deposited over the p-type layer 53. In embodiments in which the layer 53 is roughened to improve light extraction, the top surface of layer 53 is etched to provide the desired scattering features before layer 96 is deposited. A patterned metal layer is then deposited to provide the serial connection electrode 97 and contacts 98 and 99 that are used to power light source 90.

As noted above, embodiments of the present invention in which serial connection electrode 97 is constructed from ITO have advantages in terms of light extraction. In such embodiments, the serial connection electrode is constructed from ITO or a similar transparent conductor, the serial connection electrode is deposited at the same time as layer 96.

Figure 10A:
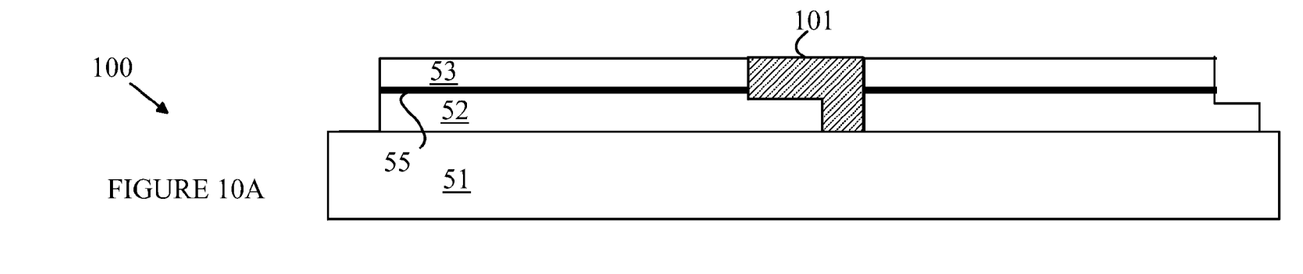
FIGS. 10A-10C are cross-sectional views of a portion of a wafer having a light source in which the isolation trench is filled with glass.
Figure 10B:
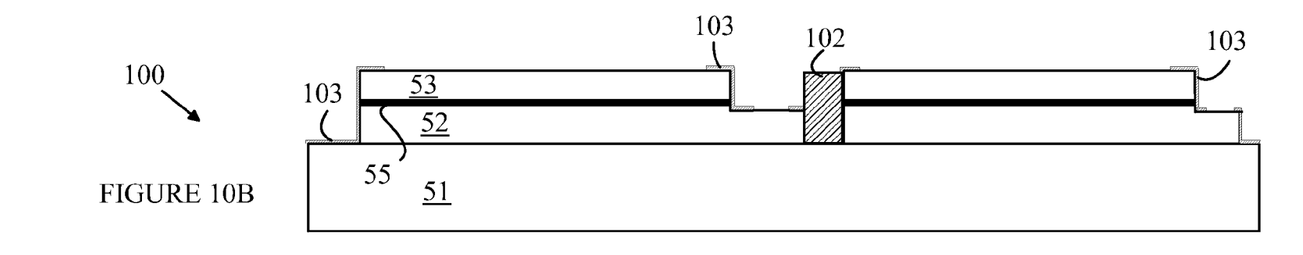
Figure 10C:
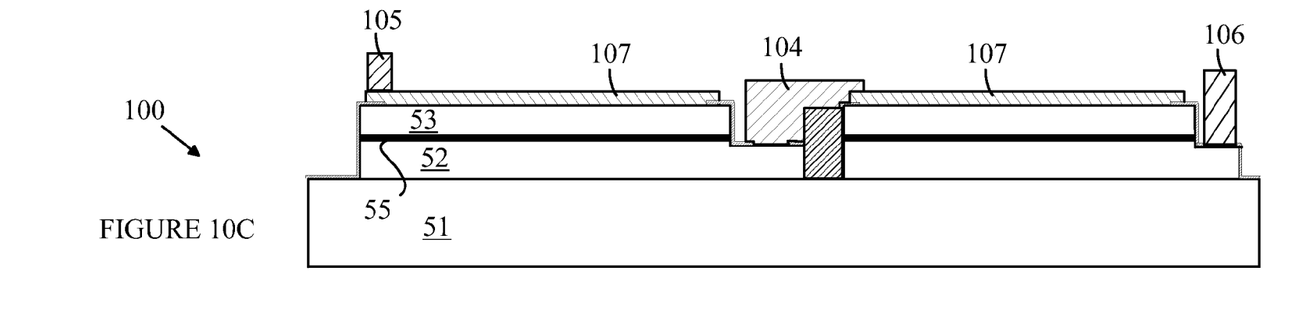

The construction of embodiments in which the isolation trench includes a clear insulator are constructed in an analogous manner. Refer now to FIGS. 10A-10C, which are cross-sectional views of a portion of a wafer having a light source 100 in which the isolation trench is filled with glass. Refer now to FIG. 10A. The fabrication process proceeds in the same manner as described above with respect to FIGS. 9A and 9B. After the isolation trench has been opened, the isolation trench is filled with glass as shown at 101. The glass layer is then partially etched to open a trench down to the plateau in layer 52 leaving a glass wall 102 as shown in FIG. 10B. A patterned layer 103 of SiN is then deposited as shown at 103. An ITO layer 107 is then deposited over the surface of layer 53 as shown at 107 in FIG. 10C and a patterned metal layer is deposited to form a serial connection electrode 104 and power contacts 105 and 106.

Figure 11:
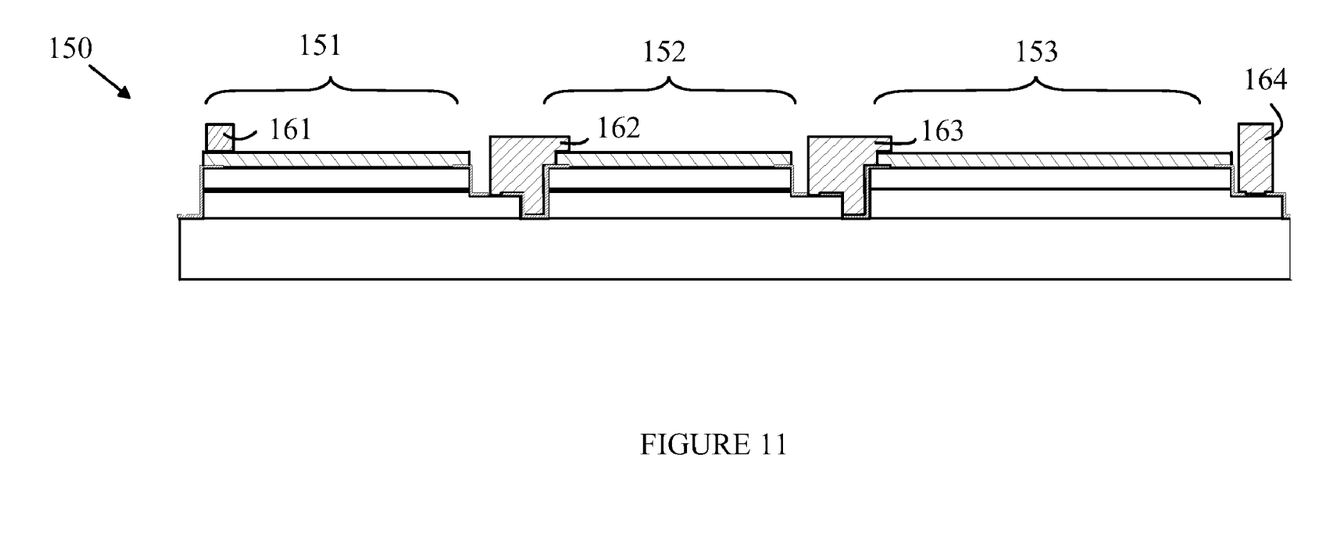
FIG. 11 is a cross-sectional view of a light source having three segments.

The above-described embodiments of the present invention have only two segments. However, light sources having more than two segments can be constructed without deviating from the teachings of the present invention. Refer now to FIG.

11, which is a cross-sectional view of a light source having three segments. Light source 150 utilizes segments 151-153 that are connected in series with the aid of series connection electrodes 162 and 163. The light source is powered by applying a potential difference greater than or equal to three times the voltage needed to power each of the individual segments between contacts 161 and 164. Light sources having even more segments can be constructed by duplicating segment 152.

The above-described embodiments of the present invention have been provided to illustrate various aspects of the present invention. However, it is to be understood that different aspects of the present invention that are shown in different specific embodiments can be combined to provide other embodiments of the present invention. In addition, various modifications to the present invention will become apparent to those skilled in the art from the foregoing description and accompanying drawings. Accordingly, the present invention is to be limited solely by the scope of the following claims.

What is claimed is:

1. A light source comprising
a substrate;
a light emitting structure comprising:
a first layer of semiconductor material of a first conductivity type deposited on said substrate;
an active layer overlying said first layer; and
a second layer of semiconductor material of an opposite conductivity type from said first conductivity type overlying said active layer;
a transparent conducting layer overlying said second layer of semiconductor material;
a barrier that divides said light emitting structure into first and second segments that are electrically isolated from one another;
a serial connection electrode that connects said first layer in said first segment to said transparent conducting layer in said second segment;
an insulating layer between said second layer and said transparent conducting layer in said second segment, said insulating layer underlying said serial connection electrode such that current flowing from said serial connection electrode is blocked by said insulating layer in a region underlying said serial connection electrode;
a first power contact electrically connected to said second layer in said first segment; and
a second power contact electrically connected to said first layer in said second segment, wherein said first and second segments generate light when a potential difference is created between said first and second power contacts.

2. The light source of claim 1 wherein said barrier comprises a trench extending through said light emitting structure.

3. The light source of claim 2 wherein said serial connection electrode comprises a layer of electrically conducting material deposited in said trench, said trench having an insulating layer that prevents said layer of electrically conducting material from making direct contact with said first layer or said active layer in said second segment.

4. The light source of claim 2 comprising an insulating layer underlying a portion of said serial connection electrode that overlies said active layer in said second segment.

5. The light source of claim 3 wherein said electrically conducting material comprises a metal.

6. The light source of claim 3 wherein said electrically conducting material comprises ITO.

7. The light source of claim 2 wherein said barrier is transparent to light traveling in said first layer.

8. A method for fabricating a light source, said method comprising
depositing a light emitting structure on a substrate, said light emitting structure comprising:
a first layer of semiconductor material of a first conductivity type deposited on said substrate;
an active layer overlying said first layer;
a second layer of semiconductor material of an opposite conductivity type from said first conductivity type overlying said active layer;
an insulting pad on said second layer of semiconductor material; and
a transparent conducting layer overlying said second layer of semiconductor material and said insulating pad;
generating a barrier that divides said light emitting structure into first and second segments that are electrically isolated from one another;
depositing a serial connection electrode that connects said first layer in said first segment to said transparent conducting layer in said second segment, said serial connection electrode overlying said insulating pad such that current flowing from said serial connection electrode is blocked by said insulating pad in a region underlying said serial connection electrode;
providing a first power contact electrically connected to said second layer in said first segment; and
providing a second power contact electrically connected to said first layer in said second segment, wherein said first and second segments generate light when a potential difference is created between said first and second power contacts.

9. The method of claim 8 wherein said barrier is generated by etching a trench extending through said light emitting structure to said substrate.

10. The method of claim 9 wherein depositing said serial connection electrode comprises depositing an insulating layer in said trench, and depositing a layer of electrically conducting material in said trench over said insulating layer, said insulating layer preventing said layer of electrically conducting material from making direct contact with said first layer or said active layer in said second segment.

11. The method of claim 9 wherein said insulating layer underlies a portion of said serial connection electrode that overlies said active layer in said second segment.

12. The method of claim 10 wherein said electrically conducting material comprises a metal.

13. The method of claim 10 wherein said electrically conducting material comprises ITO.

14. The method of claim 9 wherein said barrier is transparent to light traveling in said first layer.

* * * * *

UNITED STATES PATENT AND TRADEMARK OFFICE
CERTIFICATE OF CORRECTION

PATENT NO. : 8,207,543 B2
APPLICATION NO. : 13/049492
DATED : June 26, 2012
INVENTOR(S) : Ghulam Hasnain It is certified that error appears in the above-identified patent and that said Letters Patent is hereby corrected as shown below:

IN THE CLAIMS:

Column 8, Claim 7, Line 8: Replace "harrier" with --barrier--.

Signed and Sealed this
Seventh Day of August, 2012

David J. Kappos
*Director of the United States Patent and Trademark Office*